United States Patent
Zang et al.

(10) Patent No.: US 10,488,718 B2
(45) Date of Patent: Nov. 26, 2019

(54) DUAL-GATE ARRAY SUBSTRATE AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Pengcheng Zang, Beijing (CN); Weiyun Huang, Beijing (CN); Xiaojing Qi, Beijing (CN); Tingliang Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

(*) Notice: Subject to any disclaimer, the term of this patent is extended or adjusted under 35 U.S.C. 154(b) by 12 days.

(21) Appl. No.: 15/519,596

(22) PCT Filed: May 5, 2016

(86) PCT No.: PCT/CN2016/081109
§ 371 (c)(1),
(2) Date: Apr. 17, 2017

(87) PCT Pub. No.: WO2017/133095
PCT Pub. Date: Aug. 10, 2017

(65) Prior Publication Data
US 2018/0095334 A1    Apr. 5, 2018

(30) Foreign Application Priority Data
Feb. 2, 2016 (CN) .......................... 2016 1 0074047

(51) Int. Cl.
*G02F 1/1343* (2006.01)
*G02F 1/1362* (2006.01)
(Continued)

(52) U.S. Cl.
CPC .. *G02F 1/134336* (2013.01); *G02F 1/133707* (2013.01); *G02F 1/134309* (2013.01);
(Continued)

(58) Field of Classification Search
CPC ... G02F 2001/134318; G02F 1/134363; G02F 1/134336
See application file for complete search history.

(56) References Cited

U.S. PATENT DOCUMENTS 5,946,058 A   8/1999 Kamada et al.
6,040,882 A   3/2000 Jun et al.
(Continued)

FOREIGN PATENT DOCUMENTS

CN   1794067 A    6/2006
CN   101661174 A  3/2010
(Continued)

OTHER PUBLICATIONS

English translation of International Search Report and Written Opinion of International Application No. PCT/CN2016/081109, dated Nov. 1, 2016, 13 pages.
(Continued)

*Primary Examiner* — Lucy P Chien
(74) *Attorney, Agent, or Firm* — Westman, Champlin & Koehler, P.A.

(57) ABSTRACT

A dual-gate array substrate includes: a plurality of gate lines arranged in a first direction; a plurality of primary signal lines and secondary signal lines arranged alternately and arrayed in a second direction; a plurality of pixel units being enclosed and defined by jointing adjacent two of the gate lines insulatively with the primary signal lines or the secondary signal lines, the primary signal lines being connected to a drive unit, and being connected respectively to the pixel units that are adjacent thereto. Common electrodes are
(Continued)

further provided to include a plurality of main electrodes and a plurality of branching electrodes. The secondary signal lines are connected to the common electrodes, and an orthographic projection of the main electrode on the dual-gate array substrate has overlapping regions respectively with orthographic projections of corresponding ones, adjacent to the main electrode, of the pixel electrodes on the dual-gate array substrate and at least covers the primary signal line.

12 Claims, 6 Drawing Sheets

(51) Int. Cl.
  *H01L 27/12* (2006.01)
  *G02F 1/1337* (2006.01)
(52) U.S. Cl.
  CPC ...... *G02F 1/136286* (2013.01); *H01L 27/124* (2013.01); *G02F 2001/134372* (2013.01)

(56) References Cited

U.S. PATENT DOCUMENTS

| | | | |
|---|---|---|---|
| 7,405,427 | B2 | 7/2008 | Lee et al. |
| 8,107,029 | B2 | 1/2012 | Peng et al. |
| 8,129,723 | B2 | 3/2012 | Lee et al. |
| 9,123,873 | B2 | 9/2015 | Park et al. |
| 9,323,111 | B2 | 4/2016 | Um et al. |
| 9,366,890 | B2 | 6/2016 | Kim et al. |
| 9,496,286 | B2 | 11/2016 | Jeon et al. |
| 9,515,096 | B2 | 12/2016 | Park et al. |
| 9,995,976 | B2 | 6/2018 | Jia et al. |
| 2009/0102994 | A1* | 4/2009 | Oh .................. G02F 1/134363 349/38 |
| 2010/0053530 | A1 | 3/2010 | Peng et al. |
| 2010/0225859 | A1 | 9/2010 | Tsai et al. |
| 2011/0096600 | A1* | 4/2011 | Noguchi ............ G11C 16/0483 365/185.05 |
| 2014/0098319 | A1* | 4/2014 | Jeon .................. G02F 1/133707 349/46 |
| 2014/0125626 | A1* | 5/2014 | Yang ................. G02F 1/134336 345/174 |
| 2014/0226100 | A1* | 8/2014 | Kim .................. G02F 1/134363 349/43 |
| 2016/0252793 | A1* | 9/2016 | Cheng ............... G02F 1/134363 257/72 |
| 2017/0038657 | A1 | 2/2017 | Jeon et al. |
| 2017/0108745 | A1 | 4/2017 | Jia et al. |

FOREIGN PATENT DOCUMENTS

| | | | | | |
|---|---|---|---|---|---|
| CN | 102998859 | A | | 3/2013 | |
| CN | 103713431 | A | | 4/2014 | |
| CN | 103926770 | A | | 7/2014 | |
| CN | 103941488 | A | | 7/2014 | |
| CN | 103984162 | A | | 8/2014 | |
| CN | 203941365 | U | * | 11/2014 | ........... G02F 1/1362 |
| CN | 104714345 | A | | 6/2015 | |
| CN | 105159001 | A | | 12/2015 | |
| KR | 10-0209281 | B1 | | 7/1999 | |

OTHER PUBLICATIONS

English Translation of Notification of Transmittal of International Search Report and Written Opinion of the International Searching Authority, or Declaration from International Application No. PCT/CN2016/081109, dated Jan. 11, 2016, 4 pages.
English Translation of the International Search Report from International Application No. PCT/CN2016/081109, dated Oct. 12, 2016, 9 pages.
English Translation of the Written Opinion of the international Searching Authority from International Application No. PCT/CN2016/081109, dated Nov. 1, 2016, 4 pages.
International Search Report and Written Opinion, including English translation of Box No. V. of the Written Opinion, of International Application No. PCT/CN2016/095992, dated Nov. 1, 2016, 14 pages.
First Office Action, including Search Report, for Chinese Patent Application No. 201610074047.1, dated May 3, 2018, 10 pages.

* cited by examiner

DUAL-GATE ARRAY SUBSTRATE AND DISPLAY DEVICE

CROSS-REFERENCE TO RELATED APPLICATIONS

This application is a Section 371 National Stage Application of International Application No. PCT/CN2016/081109, filed on May 5, 2016, entitled "DUAL-GATE ARRAY SUBSTRATE AND DISPLAY DEVICE", which claims priority to Chinese Application No. 201610074047.1, filed on Feb. 2, 2016, incorporated herein by reference in their entirety.

BACKGROUND

1. Technical Field

The present disclosure relates to display technical field, and particularly relates to a dual-gate array substrate and a display device.

2. Description of the Related Art

With increase of resolution of a display panel, performance and cost of a drive integrated circuit (IC) necessarily increase. Thus, in order to reduce cost of the drive integrated circuit (IC) while increasing binding yield of the drive integrated circuit (IC), a design scheme of dual-gate drive is commonly used in a display panel. However, it is still needed to further improve an opening rate and transmission of the display panel.

SUMMARY

Embodiments of the present disclosure provide a dual-gate array substrate and a display device, which have increased transmission relative to the dual-gate array substrate in related art.

Embodiments of the present disclosure include the following technical solutions.

A dual-gate array substrate includes:

a plurality of gate lines arranged in a first direction;

a plurality of primary signal lines and secondary signal lines arranged alternately and arrayed in a second direction;

a plurality of pixel units being enclosed and defined by jointing adjacent two of the gate lines insulatively with the primary signal lines or the secondary signal lines, the primary signal lines being connected to a drive unit, and being connected respectively to the pixel units that are adjacent thereto;

wherein the dual-gate array substrate further includes common electrodes including a plurality of main electrodes and a plurality of branching electrodes;

wherein the secondary signal lines being connected to the common electrodes, and an orthographic projection of the main electrode on the dual-gate array substrate has overlapping regions respectively with orthographic projections of corresponding ones, adjacent to the main electrodes, of the pixel electrodes on the dual-gate array substrate and at least covers the primary signal line.

In an embodiment of the present disclosure, a width of the secondary signal line is not greater than a width of the primary signal line.

In an embodiment of the present disclosure, the main electrodes of the common electrodes are arranged in an extension direction of the primary signal lines, the branching electrodes are arranged to be parallel to the main electrodes, a pattern of the common electrodes formed by any adjacent two of the main electrodes and the secondary electrodes between the two main electrodes corresponds to a corresponding one of the pixel units;

wherein any two adjacent main electrodes include a first main electrode and a second main electrode, an orthographic projection of a first main electrode on the array substrate has overlapping regions respectively with orthographic projections of the pixel electrodes, adjacent to the first main electrode, on the dual-gate array substrate, and at least covers the primary signal lines, and an orthographic projection of a second main electrode, adjacent to the first main electrode, on the dual-gate array substrate is located within a gap between two pixel electrodes, adjacent to the second main electrode, and covers the secondary signal line.

In an embodiment of the present disclosure, the orthographic projection of the second main electrode, adjacent to the first main electrode, coincides with the secondary signal line.

In an embodiment of the present disclosure, the main electrodes of the common electrodes are arranged in an extension direction of the primary signal lines, the branching electrodes are arranged in a direction across the primary signal lines, and a pattern of the common electrodes formed by any adjacent two of the main electrodes and the secondary electrodes between the two main electrodes corresponds to adjacent two of the pixel units;

wherein orthographic projections of two of the main electrodes on the array substrate have overlapping regions respectively with orthographic projections of the pixel electrodes, adjacent to the two of the main electrodes, on the dual-gate array substrate, and at least cover the main signal lines, and a pattern of the secondary electrodes at a boundary between adjacent two of the adjacent pixel units is continuous.

In an embodiment of the present disclosure, the branching electrodes are each provided with a corner structure at the boundary between the adjacent two of the pixel units.

With this configuration, uneven display caused by movement or pressure action during touch operation may be eliminated.

In an embodiment of the present disclosure, the secondary signal lines are made of metal or transparent oxide.

In an embodiment of the present disclosure, the secondary signal lines are made of tin indium oxide.

A display device includes a color film substrate, and further comprises the above dual-gate array substrate.

In an embodiment of the present disclosure, a black matrix is provided, at a position corresponding to the secondary signal lines in the dual-gate array substrate, in the color film substrate, wherein an orthographic projection of the black matrix on the dual-gate array substrate coincides with an orthographic projection of the secondary signal lines on the array substrate.

BRIEF DESCRIPTION OF THE DRAWINGS

In order to illustrate technical solutions of embodiments of the present disclosure more clearly, drawings required for description of the embodiments are introduced briefly as below. Obviously, the drawings in the below description are merely some embodiments of the present invention; for those skilled in the art, other drawings may be obtained based on these drawings without inventive labor.

DETAILED DESCRIPTION OF PREFERRED EMBODIMENTS

In order to make objects, technical solutions and advantages of the present disclosure be clearer, a further description in detailed of the present invention is made in conjunction with drawings. Obviously, embodiments described are merely some embodiments of the present invention, rather than all of them. Based on the embodiments of the present disclosure, all other embodiments that may be obtained by those skilled in the art without inventive labor belong to protective scope of the present invention.

Technical solutions related to the present invention are described in detailed below by specific embodiments and the present invention may include but is not limited to the following embodiments.

Figure 1A:
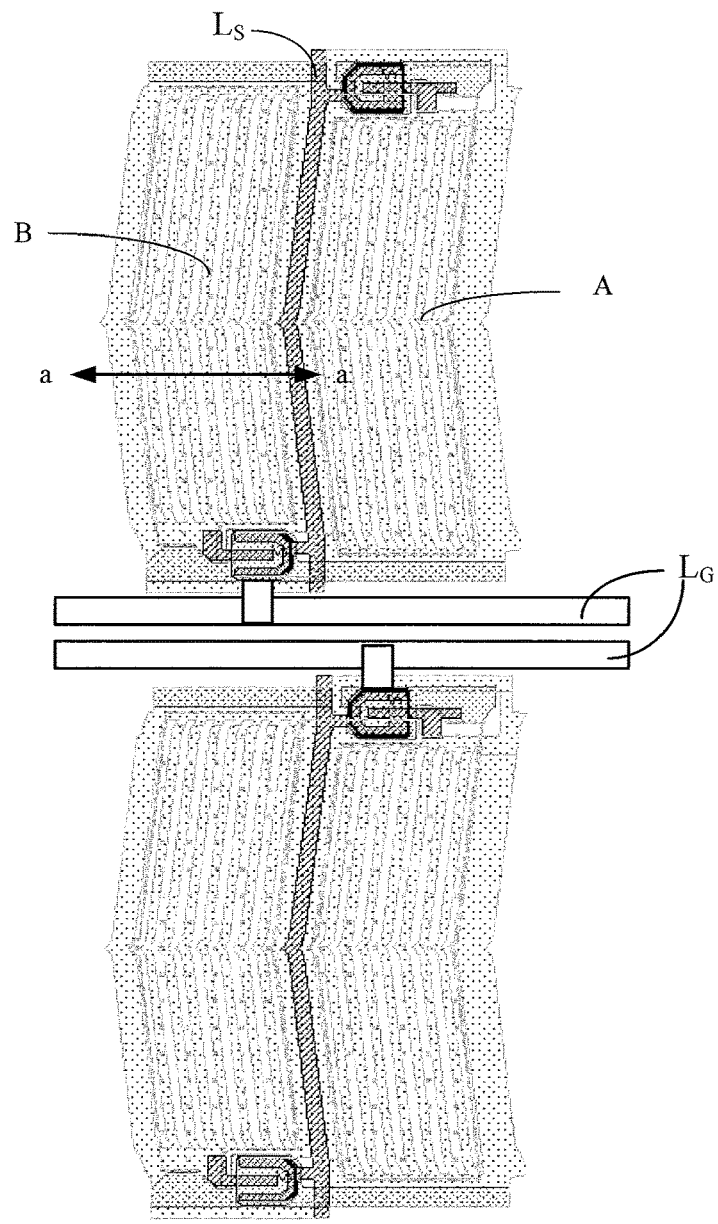
FIG. 1(a) and FIG. 1(b) are schematic views of a conventional dual-gate driven array substrate.
Figure 1B:
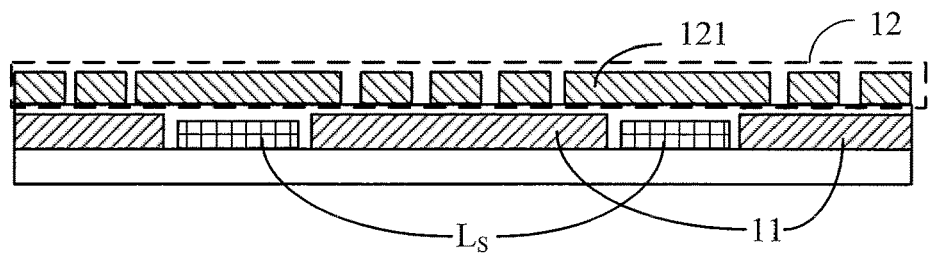

As shown in FIGS. 1(a) and 1(b), schematic views of a currently common dual-gate driven array substrate are provided. For easy description, a fringe field switch (FFS) display mode is taken as an example, in which pixel units are respectively defined as a pixel unit A and a pixel unit B, adjacent to the pixel unit A in a horizontal direction. As shown in FIG. 1(a), TFT devices of the two pixel units are respectively located over and below the pixel units, and are connected to a same data line $L_S$ through respective source electrode lines, and, gate electrodes of the TFT devices are connected to gate lines $L_G$. It can be seen that two gate lines $L_G$ are provided between two adjacent pixel units in a vertical direction, in order for convenient for achieving a dual-gate drive. Referring to a cross section structural view as shown in FIG. 1(b), in the array substrate, adjacent pixel unit A and pixel unit B are both connected to the data line $L_S$ therebetween, and no data line is provided between the pixel unit B and another adjacent pixel unit A. It can be known from FIG. 1(a) and FIG. 1(b) that, no matter whether a data line $L_S$ is provided between two adjacent pixel electrodes 11 or not, unwanted coupling capacitance will be generated. Thus, in order to reduce the coupling capacitance between adjacent pixel electrodes, it is necessary to configure main electrodes 121 of common electrodes 12 in a rather larger size at a position (as shown in the location defined by the dash line), preferably, such that a orthographic projection of the main electrodes 121, at the position, of the common electrodes on the array substrate may overlap with the adjacent pixel electrodes 11, so as to commendably shield affection of the coupling capacitance on rotation of liquid crystals.

However, as two gate lines are provided between adjacent pixel units in the dual-gate array substrate, i.e., one gate line is added compared to an array substrate in prior art, it is necessary to provide an additional black matrix correspondingly in the color film substrate, which causes decrement of an opening rate of a panel formed by the array substrate. That is, transmission of the array substrate is reduced. Further, in order to reduce coupling capacitance, area of common electrodes at gaps between adjacent pixel units is increased and thus opening rate and transmission of the array structure are reduced.

Figure 2A:
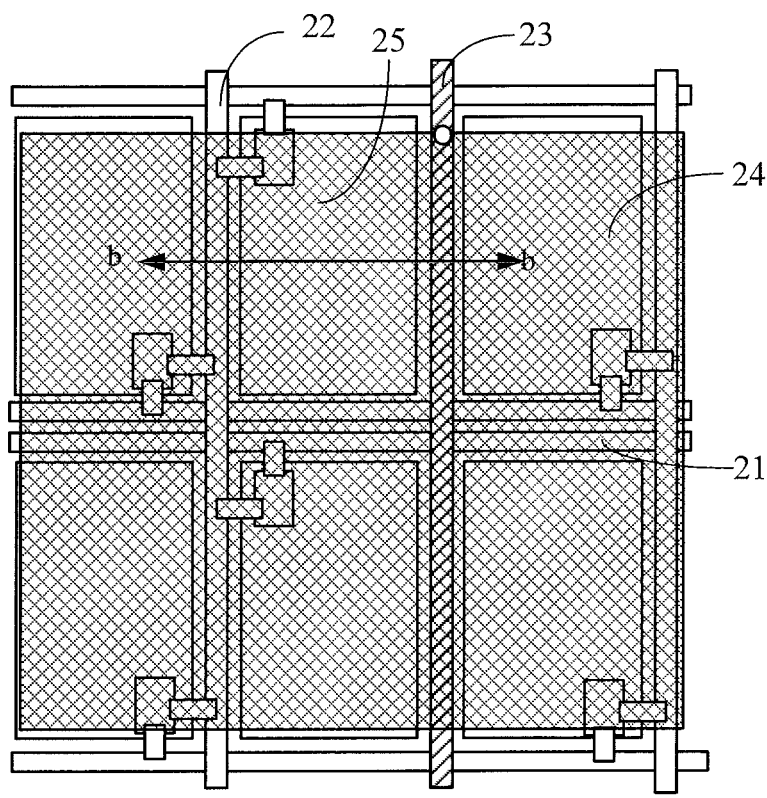
FIG. 2(a) and FIG. 2(b) are schematic structural views of a dual-gate array substrate according to an embodiment of the present disclosure.
Figure 2B:
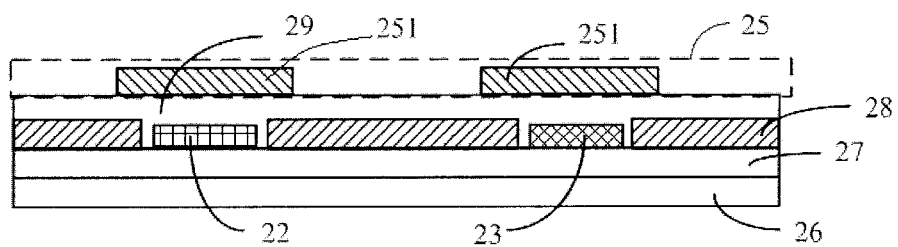

As shown in FIG. 2(a), a structural schematic view of a dual-gate array substrate according to an embodiment of the present disclosure is provided. The array substrate is mainly provided with: a plurality of gate lines 21 arranged in a first direction, a plurality of primary signal lines 22 and secondary signal lines 23 that are arranged alternately and arrayed in a second direction, and a plurality of pixel units 24 being enclosed and defined by jointing the gate lines 21 insulatively with the primary signal lines 22 and the secondary signal lines 23. The pixel units 24, adjacent to the primary signal lines 22, are respectively connected to the primary signal lines 22. The primary signal lines 22, serving as data lines, are connected to a drive unit (not shown) and the secondary signal lines 23 are connected to the common electrodes 25. Only connection relationship of these components is shown in the Figures, and specific pattern and structure of layers are not actually shown. By referring to a cross section view along b-b line as shown in FIG. 2(b), it is known that, the array substrate mainly includes: a base substrate 26, a first insulating layer 27, pixel electrodes 28 with a first pattern, primary signal lines 22 and secondary signal lines 23 alternately arranged between adjacent pixel electrodes 28, a second insulating layer 29 covering the pixel electrodes 18, the primary signal lines 22 and the secondary signal lines 23, and common electrodes 25 disposed over the second insulating layer 29. An electrical connection may be established between the secondary signal lines 23 and the common electrodes 25 through through-holes, or, in other conventional manner. The common electrodes 25 include a plurality of main electrodes 251 and a plurality of branching electrodes, and an orthographic projection of the main electrode 251 on the dual-gate array substrate has overlapping regions respectively with orthographic projections of corresponding pixel electrodes 28 adjacent to the main electrode 251 on the dual-gate array substrate, and at least covers a primary signal line 22.

It is known from above that, in order to improve the conventional dual-gate array substrate in terms of transmission, the primary signal lines and the secondary signal lines are arranged alternately within gaps between two adjacent ones of the pixel electrodes, such that the primary signal lines are configured to still be connected to the drive unit and, at respective locations, to be connected to source electrodes of the TFT within the pixel units which are located at either side of the primary signal lines, thereby achieving drive of two pixel units by a single primary signal line. Further, as the primary signal lines are generally applied with variational voltage signals, coupling capacitance is necessarily generated between the primary signal lines and their adjacent pixel electrodes. According to embodiments of the present disclosure, the main electrode is provided over the primary signal line to cover and shield the coupling capacitance. At the same time, the secondary signal line is connected to the common electrode such that a stabler voltage is applied to the secondary signal line, thereby completely avoiding occurrence of coupling capacitance between it and its adjacent pixel electrodes. Thus, according to the embodiment of the present disclosure, it is not necessary to reduce coupling capacitance in the manner of increasing size of the main electrodes in prior art, that is, it is not necessary to configure the main electrodes in large size over the secondary signal lines, and thus opening rate of the array substrate may be increased.

In the embodiment of the present disclosure, the described primary signal lines are data lines.

Further, in the embodiment of the present disclosure, a width of the secondary signal line is not greater than that of the primary signal line, such that a size of the black matrix correspondingly at a side of the array substrate facing to a color film substrate may be reduced, so as to increase opening rate of the dual-gate array substrate.

Figure 3A:
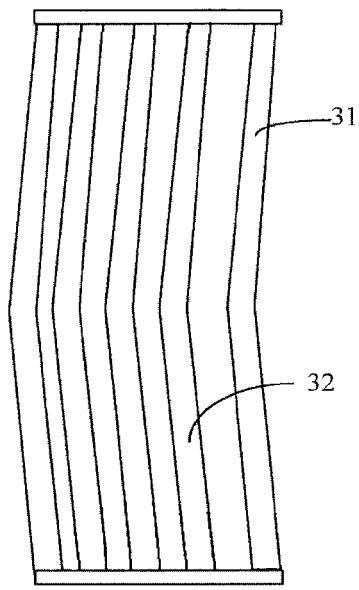
FIG. 3(a) is a schematic view of a pattern of a pixel unit in an array substrate in a FFS display mode.
Figure 3B:
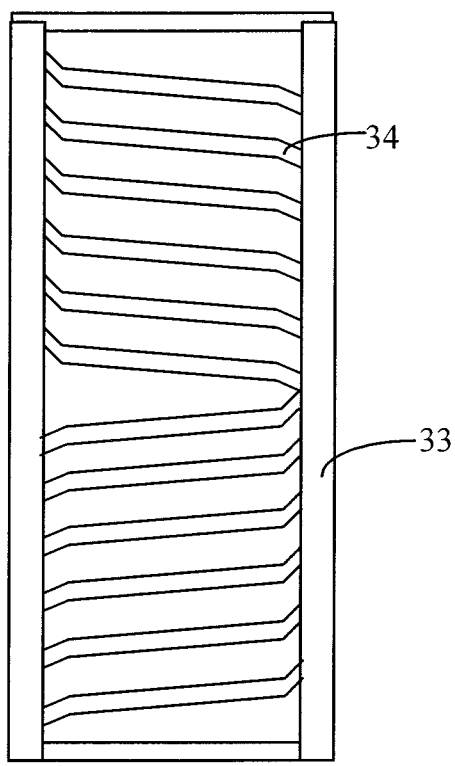
FIG. 3(b) is a schematic view of a pattern of a pixel unit in an array substrate in a AFFS display mode.

In order to describe the above solutions more clearly, some specific embodiments are described to illustrate solutions of the present disclosure. It is noted that, the present disclosure is mainly directed to structures of the dual-gate array substrate which operate in fringe field switching (FFS) and advanced fringe field switching (AFFS) display modes, respectively, in which a pattern of the common electrodes in one of the pixel units of the array substrate in the FFS display mode is shown in FIG. 3(a) and a pattern of the common electrodes in one of the pixel units of the array substrate in the AFFS display mode is shown in FIG. 3(b). The difference between structures of the array substrate in the above two display modes resides in the patterns of the common electrodes. Specifically, in the dual-gate array substrate in a FFS display mode, the main electrodes 31 and the branching electrodes 32 are arranged to be in parallel and nearly to be extended along a direction of the data lines, and generally are arranged in a zigzag shape as shown in FIG. 3(a). In the dual-gate array substrate in an AFFS display mode, the main electrodes 33 and the branching electrodes 34 are arranged nearly perpendicually, and the main electrodes 33 are arranged in an extension direction of the data lines while the branching electrodes 34 are arranged in a "V" shape between the adjacent ones of the main electrodes.

Figure 4A:
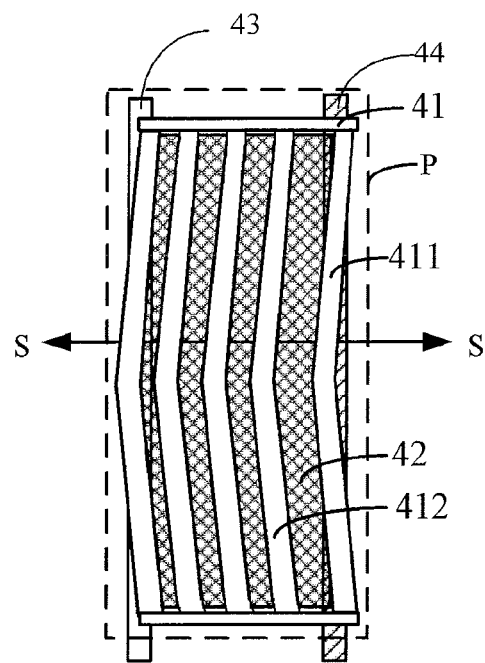
FIG. 4(a) is a schematic structural view of an array substrate in a FFS display mode according to an embodiment.

An embodiment of the present disclosure is described in conjunction with FIG. 4 as below. As shown in FIG. 4(a), a structural schematic view of the array substrate in the FFS display mode according to the embodiment of the present disclosure is provided, in which a pattern of the common electrodes formed by any two adjacent main electrodes 411 of the common electrodes 41 and the branching electrodes 412 between the two adjacent main electrodes 411 corresponds to one pixel unit P. By referring to a structural cross section view of FIG. 4(b), an orthographic projection of a first main electrode 411 (left main electrode in FIG. 4(b)) on the dual-gate array substrate has overlapping regions (as denoted by an elliptical block in dash line) respectively with orthographic projections of the pixel electrodes 42, adjacent to the first main electrode 411, on the dual-gate array substrate, and at least covers a primary signal line 43. An orthographic projection of a second main electrode 411 (right main electrode in FIG. 4(b)), adjacent to the first main electrode, on the dual-gate array substrate is located within a gap between two adjacent pixel electrodes 42 and covers a secondary signal line 44. In addition, the dual-gate array substrate further includes an insulating layer and other related layers, which are not illustrated for easy description. According to the above solution, the secondary signal lines are connected to the common electrodes such that occurrence of coupling capacitances between the secondary signal lines and their adjacent pixel electrodes may be avoided, furthermore, the orthographic projections of the main electrodes, over the secondary signal lines, on the dual-gate array substrate are configured to locate within the gaps between two adjacent pixel electrodes and cover the corresponding secondary signal lines such that a stable capacitance generated between the secondary signal lines and their adjacent pixel electrodes may overlap with a capacitance generated between the pixel electrodes and the common electrode, to obtain a storage capacitance required to the dual-gate array substrate, thereby achieving a better control on a voltage at boundary between the pixel electrodes and the common electrodes. In addition, as an electrical field for rotation of the liquid crystal in the structure in FFS display mode has the same direction as an overlapped electrical field in the overlapping region and is rather stable, an electrical field generated by the storage capacitance after being overlapped may promote the rotation of the liquid crystal in the overlapping region and thus increase transmission of the panel. Herein, it is noted that "first" and "second" do not mean any order and materiality, but are merely used for naming two different main electrodes. For example, in the embodiment, the orthographic projection of the first main electrode on the array substrate has overlapping regions with the orthographic projections of the pixel electrodes, adjacent to the first main electrode, on the dual-gate array substrate, and at least covers the corresponding primary signal line, and the orthographic projection of the second main electrode on the dual-gate array substrate is located within the gap between two adjacent pixel electrodes and covers the corresponding secondary signal line.

Figure 4B:
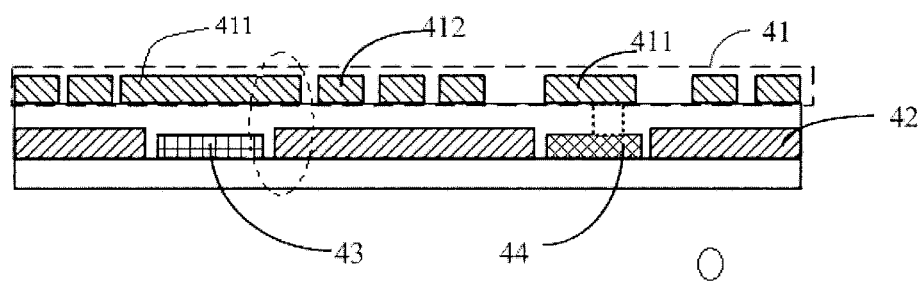
FIG. 4(b) is a schematic cross section view of the array substrate in the FFS display mode according to the embodiment.

Further, according to the above embodiment, the orthographic projection of the second main electrode (the right main electrode in FIG. 4(b)), adjacent to the first main electrode, on the dual-gate array substrate may coincide with the secondary signal line. In view that the electrical field for rotation of the liquid crystal in the present disclosure is an edge electrical field between the pixel electrodes and the common electrodes, in order to obtain a good overlapping between the edge electrical field, between the pixel electrodes and the common electrodes, and an edge electrical field, between the pixel electrodes and the secondary signal line, and to avoid affection on the edge electrical field, between the pixel electrodes and the common electrodes, from the edge electrical field, between the pixel electrodes and the secondary signal line, preferably, the orthographic projection of the main electrode of the common electrode on the dual-gate array substrate coincide with the secondary signal line. With this configuration, the overlapped edge electrical field may obtain an optimal value to improve rotation of the liquid crystal in the boundary between the pixel electrodes and the common electrodes and thus to improve transmission of the panel.

Figure 5A:
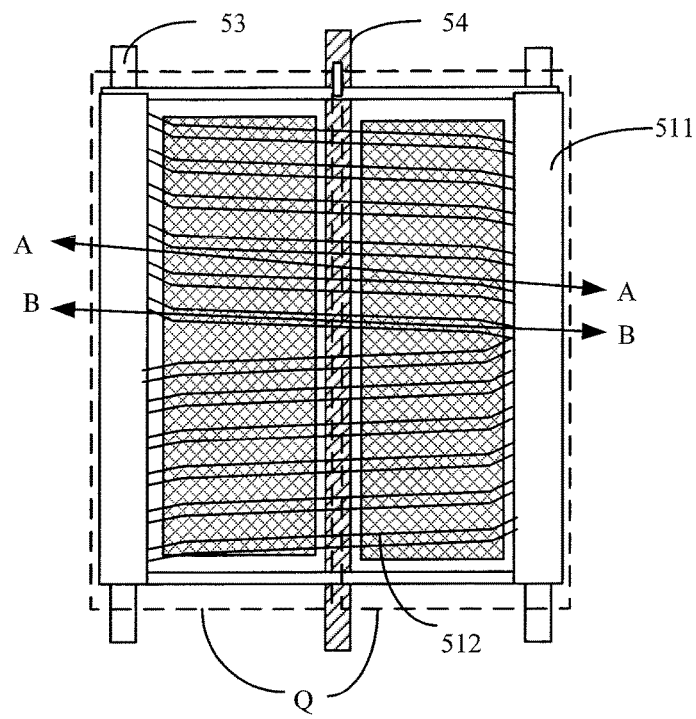
FIG. 5(a) is a schematic structural view of an array substrate in an AFFS display mode according to another embodiment of the present disclosure.
Figure 5B:
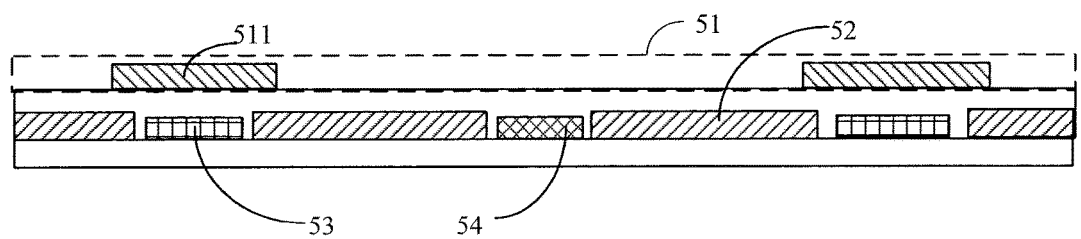
FIG. 5(b) and FIG. 5(c) are respectively schematic cross section views, along line A-A and line B-B, of the array substrate in the AFFS display mode according to the another embodiment of the present disclosure.
Figure 5C:
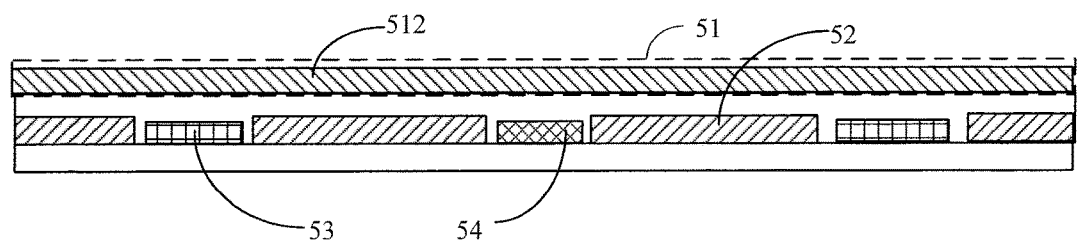

An embodiment of the present disclosure is described as below by referring to FIG. 5. As shown in FIG. 5(a), a structural schematic view of an array substrate in AFFS display mode according to another embodiment is provided, in which main electrodes 511 of common electrodes 51 are arranged in an extension direction of primary signal lines 53, branching electrodes 512 are arranged in a direction transverse to the primary signal lines 53, or, in other words, the branching electrodes 512 are arranged in a direction across the primary signal lines 53. A pattern of the common electrodes formed by any adjacent two of the main electrodes 511 and the branching electrodes 512 therebetween corresponds to two adjacent pixel units Q. Referring to a cross section view along line A-A of FIG. 5(b) and a cross section view along line B-B of FIG. 5(c), orthographic projections of two main electrodes 511 on the dual-gate array substrate have overlapping regions with orthographic projections of the pixel electrodes 52, adjacent to the respective main electrode 511, on the dual-gate array substrate, respectively and at least cover the primary signal lines 53. A pattern of the branching electrodes 512 at a boundary between two adjacent pixel units Q is continuous. According to the above solution, the secondary signal lines 54 are connected to the common electrodes so as to prevent occurrence of coupling capacitance between the secondary signal lines and their adjacent pixel electrodes. Further, in this display mode, as the direction of the electrical field for rotation of the liquid crystal is different from that of the overlapped electrical field in the overlapping region, the main electrodes disposed over the secondary signal lines may be removed while increasing the size of the pixel electrodes adjacent to the secondary signal lines, such that the overlapping regions between the branching electrodes and the pixel electrodes increases (referring to the cross section view as shown in FIG. 5(c)). Further, as increase of the overlapping region may increase the electrical field for rotation of the liquid crystal, and more critically, the increased overlapping region is located at boundary between the pixel electrode and the secondary signal line, the rotation of the liquid crystal at the boundary may be promoted and thus transmission of the panel may be increased.

Figure 6:
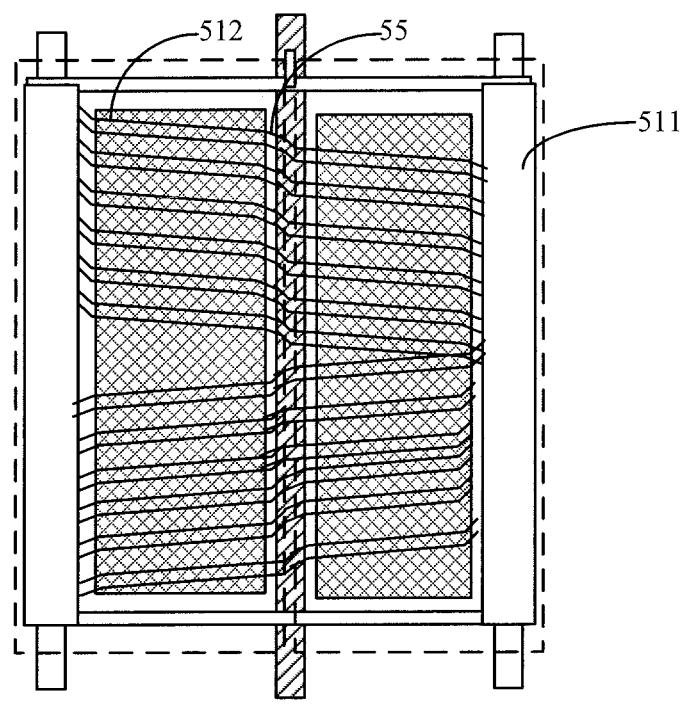
FIG. 6 is a schematic view of the branching electrodes, each having a corner structure, of the common electrodes in the another embodiment of the present disclosure.

Further, according to the above another embodiment, referring to FIG. 6, the branching electrodes 512 are each provided with a corner structure 55 at the boundary between the two adjacent pixel units Q. As s signal line is also disposed between the adjacent pixel units, a black matrix is needed for blocking. In this instant, it tends to encounter a display defect due to touch operation at the region where the signal line is located. As such, according to the present disclosure, the corner structure is provided at the boundary between the adjacent pixel units, to eliminate the display defect and thereby to alleviate uneven display caused by movement or pressure action during touch operation.

In an embodiment of the present disclosure, the secondary signal line is made of metal or transparent oxide.

In a possible embodiment, the secondary signal line is made of tin indium oxide, in order to improve transmission of the dual-gate array substrate.

In addition, according to embodiments of the present disclosure, there further provides a display device including a color film substrate and, the dual-gate array substrate provided by any one of the embodiments of the present disclosure.

In an embodiment of the present disclosure, a black matrix is provided, in the color film substrate, at position corresponding to locations of the secondary signal lines in the dual-gate array substrate, in which orthographic projection of the black matrix on the dual-gate array substrate coincide with orthographic projection of the secondary signal lines on the dual-gate array substrate.

The display device according to the present disclosure may be any products or components that have a display function, including a liquid crystal panel, a mobile phone, a tablet computer, a television, a display, a notebook computer, a digital photo frame, a navigator and the like. Other components that are indispensable to compose the display device may be obtained, as being understood by those skilled in the art, and are not described in detailed, and should not be considered as limitation of the present invention.

Although the preferable embodiments of the present disclosure have been described, other variations and modifications of these embodiments may be made as long as those skilled in the art may understand the basic inventive concept of the present disclosure. The attached claims are intended to be interpreted to include the preferable embodiments and all variations and modifications that are fallen into the protective scope of the present disclosure.

Obviously, modifications and changes may be made within the spirit and scope of the present disclosure by those skilled in the art. Thus, provided that these modifications and changes would belong to the scope of the claims and their equal technology of the present invention, they were intended to be included in the scope of the present invention.

What is claimed is:

1. A dual-gate array substrate, comprising:
    a plurality of gate lines arranged in a first direction;
    a plurality of primary signal lines and secondary signal lines arranged alternately and arrayed in a second direction;
    a plurality of pixel units being enclosed and defined by jointing adjacent two of the gate lines insulatively with the primary signal lines or the secondary signal lines, the primary signal lines being connected to a drive unit, and being connected respectively to the pixel units that are adjacent thereto;
    wherein the dual-gate array substrate further comprises common electrodes comprising a plurality of main electrodes and a plurality of branching electrodes; and
    the secondary signal lines are connected to the common electrodes, and an orthographic projection of ones of the main electrodes on the dual-gate array substrate has overlapping regions respectively with orthographic projections of corresponding ones, adjacent to the one main electrode, of pixel electrodes of the pixel units on the dual-gate array substrate and at least covers one, adjacent to the one main electrode, of the primary signal lines;
    wherein, a width of the secondary signal line is not greater than a width of the primary signal line;
    wherein any two adjacent main electrodes include a first main electrode and a second main electrode, an orthographic projection of the first main electrode on the array substrate has overlapping regions respectively with orthographic projections of the pixel electrodes, adjacent to the first main electrode, on the dual-gate array substrate, and at least covers the primary signal lines, and an orthographic projection of a second main electrode, adjacent to the first main electrode, on the dual-gate array substrate is located within a gap between two pixel electrodes, adjacent to the second main electrode, and covers one, adjacent to the second main electrode, of the plurality of secondary signal line.

2. The dual-gate array substrate according to claim 1, wherein, the main electrodes of the common electrodes are arranged in an extension direction of the primary signal lines, the branching electrodes are arranged to be parallel to the main electrodes, a pattern of the common electrodes formed by any adjacent two of the main electrodes and one of the branching electrodes between the two main electrodes corresponds to a corresponding one of the pixel units.

3. The dual-gate array substrate according to claim 2, wherein, the orthographic projection of the second main electrode, adjacent to the first main electrode, on the dual-gate array substrate coincides with the secondary signal line.

4. The dual-gate array substrate according to claim 1, wherein, the main electrodes of the common electrodes are arranged in an extension direction of the primary signal lines, the branching electrodes are arranged in a direction across the primary signal lines, and a pattern of the common electrodes formed by any adjacent two of the main electrodes and the branching electrodes between the two main electrodes corresponds to adjacent two of the pixel units;
  wherein orthographic projections of two of the main electrodes on the dual-gate array substrate have overlapping regions respectively with orthographic projections of the pixel electrodes, adjacent to the two of the main electrodes, on the dual-gate array substrate, and at least cover ones, adjacent to the two of the main electrodes, of the plurality of primary signal lines, and a pattern of the branching electrodes at a boundary between adjacent two of the adjacent pixel units is continuous.

5. The dual-gate array substrate according to claim 4, wherein, the branching electrodes are each provided with a corner structure at the boundary between the adjacent two of the pixel units.

6. The dual-gate array substrate according to claim 1, wherein, the secondary signal lines are made of metal or transparent oxide.

7. The dual-gate array substrate according to claim 6, wherein, the secondary signal lines are made of tin indium oxide.

8. The dual-gate array substrate according to claim 1, wherein, the primary signal lines comprise data lines.

9. A display device comprising a color film substrate, wherein, the display device further comprises the dual-gate array substrate according to claim 1.

10. The display device according to claim 9, wherein, a black matrix is provided, at a position corresponding to the secondary signal lines in the dual-gate array substrate, in the color film substrate, wherein an orthographic projection of the black matrix on the dual-gate array substrate coincides with an orthographic projection of the secondary signal lines on the dual-gate array substrate.

11. The dual-gate array substrate according to claim 1, wherein, the main electrodes of the common electrodes are arranged in an extension direction of the primary signal lines, the branching electrodes are arranged to be parallel to the main electrodes, a pattern of the common electrodes formed by any adjacent two of the main electrodes and ones of the branching electrodes between the two main electrodes corresponds to a corresponding one of the pixel units; wherein any two adjacent main electrodes include a first main electrode and a second main electrode, an orthographic projection of the first main electrode on the array substrate has overlapping regions respectively with orthographic projections of the pixel electrodes, adjacent to the first main electrode, on the dual-gate array substrate, and at least covers the primary signal lines, and an orthographic projection of a second main electrode, adjacent to the first main electrode, on the dual-gate array substrate is located within a gap between two pixel electrodes, adjacent to the second main electrode, and covers one, adjacent to the second main electrode, of the secondary signal lines.

12. The dual-gate array substrate according to claim 1, wherein, the main electrodes of the common electrodes are arranged in an extension direction of the primary signal lines, the branching electrodes are arranged in a direction across the primary signal lines, and a pattern of the common electrodes formed by any adjacent two of the main electrodes and ones of the branching electrodes between the two main electrodes corresponds to adjacent two of the pixel units; wherein orthographic projections of two of the main electrodes on the dual-gate array substrate have overlapping regions respectively with orthographic projections of the pixel electrodes, adjacent to the two of the main electrodes, on the dual-gate array substrate, and at least cover the primary signal lines, and a pattern of the branching electrodes at a boundary between adjacent two of the adjacent pixel units is continuous.

* * * * *